United States Patent [19]

Tsuji et al.

[11] Patent Number: 5,004,520
[45] Date of Patent: Apr. 2, 1991

[54] METHOD OF MANUFACTURING FILM CARRIER

[75] Inventors: Masahiro Tsuji; Susumu Kawauchi, both of Kangawa; Hiroshi Nakayama, Tokyo, all of Japan

[73] Assignee: Nippon Mining Co., Ltd., Tokyo, Japan

[21] Appl. No.: 444,575

[22] Filed: Dec. 1, 1989

Related U.S. Application Data

[62] Division of Ser. No. 160,479, Feb. 25, 1988.

[30] Foreign Application Priority Data

Mar. 4, 1987 [JP] Japan .................. 62-47540
Jul. 7, 1987 [JP] Japan ................. 62-167896
Jul. 7, 1987 [JP] Japan ................. 62-167897

[51] Int. Cl.$^5$ .............. C23F 1/02; B44C 1/22; C03C 15/00; C03C 25/06
[52] U.S. Cl. ..................... 156/630; 29/827; 156/634; 156/656; 156/659.1; 156/902; 357/70; 437/220
[58] Field of Search .............. 156/629, 630, 634, 656, 156/659.1, 666, 901, 902; 29/827, 846; 357/69, 70; 427/96; 361/421; 174/68.5; 428/137, 209, 457, 458, 601, 901; 437/182, 183, 206, 217, 220, 247, 248

[56] References Cited

U.S. PATENT DOCUMENTS

| 3,728,178 | 4/1973 | Caule | 156/630 |
| 4,719,134 | 1/1988 | Ely | 428/90 |
| 4,731,287 | 3/1988 | Noda et al. | 428/90 |
| 4,762,747 | 8/1988 | Lier et al. | 428/458 |
| 4,764,413 | 8/1988 | Nukii et al. | 428/458 |

Primary Examiner—William A. Powell
Attorney, Agent, or Firm—Seidel, Gonda, Lavorgna & Monaco

[57] ABSTRACT

There is provided a film carrier comprising a resin base film and a rolled copper foil laminated thereon, said rolled copper foil forming leads for mounting semiconductor chips or other electronic components in place, characterized in that said rolled copper foil is made of a copper alloy composition consisting essentially of a total of 0.005 to 1.5% by weight of one or two or more selected from a group consisting of

| P  | 0.005–0.05 | wt %, | B  | 0.005–0.05 | wt %, |
| Al | 0.01–0.5   | wt %, | As | 0.01–0.5   | wt %, |
| Cd | 0.01–0.5   | wt %, | Co | 0.01–0.5   | wt %, |
| Fe | 0.01–0.5   | wt %, | In | 0.01–0.5   | wt %, |
| Mg | 0.01–0.5   | wt %, | Mn | 0.01–0.5   | wt %, |
| Ni | 0.01–0.5   | wt %, | Si | 0.01–0.5   | wt %, |
| Sn | 0.01–0.5   | wt %, | Te | 0.01–0.5   | wt %, |
| Ag | 0.01–1     | wt %, | Cr | 0.01–1     | wt %, |
| Hf | 0.01–1     | wt %, | Zn | 0.01–1     | wt % and |
| Zn | 0.01–1     | wt %  |    |            |       | and the remainder Cu with inevitable impurities, preferably with oxygen content of not more than 50 ppm. There is also provided a method for manufacturing a film carrier characterized in that the leads of the film carrier for mounting semiconductor chips or other electronic components in place are formed by the steps of providing a rolled copper alloy foil having the composition defined above, preferably strain relief annealing it after its final cold rolling and then laminating the annealed foil onto a resin base film followed by etching.

24 Claims, 1 Drawing Sheet

METHOD OF MANUFACTURING FILM CARRIER

This is a division of application Ser. No. 160,479 filed Feb. 25, 1988.

FIELD OF THE INVENTION

This invention relates to a film carrier having leads suited for mounting and packaging semiconductor chips and other electronic components on printed-circuit boards and also to a method of manufacturing the same.

BACKGROUND OF THE INVENTION

Semiconductor chips such as ICs and LSIs are usually as small as several millimeters square and about 100 microns thick and are difficult to mount as they are on printed-circuit boards. To facilitate the mounting, it is customary to contain each chip in a certain housing known as an IC or LSI package.

The IC or LSI package basically has a structure in which a semiconductor chip is attached to a heat sink, or a heat-radiating metal sheet, and electrode terminals of the chip and leads for connection to external circuits are joined by bonding wires.

The leads project from the package like the legs of a centipede, and are also called pins.

Such IC and LSI packages prevailing at present day are classified into two dominant types; dual in-line package (DIP) having two rows of pins extending vertically downward from the package body at opposite sides thereof and flat package (FP) with pins projecting from all four edges of the package body in the same plane.

The FP type is advantageous over the DIP type because it can use some more leads (pins) and thereby slightly increase the packaging density on printed boards.

However, the recent tendency toward even higher degrees of integration for LSIs has accordingly increased the number of pins for the individual packages. The FP and DIP types are both failing to keep up with the tendency, and there is a need for a now packaging system capable of accommodating the rapidly increasing number of pins.

In an effort to meet the requirement, a new mounting and packaging system using a "film carrier" (also known as tape carrier or tab) has been developed.

The film carrier, as shown in FIG. 1, is based on a length of tape 2 formed with sprocket holes 1. The tape 2, or the base using a polyimide, polyester, polyether sulfone (PES), polyparabanic acid (PPA) or such, like resin, is covered with a copper foil. The foil in turn is photoetched to provide copper inner leads (fingers for chip bonding) 3 and copper outer leads (fingers for external connections) 4. The numeral 5 indicates testing pads.

The inner leads 3, outer leads 4, and the like in a fine pattern are collectively called leads in this specification.

The process steps in common use will now be described in some more detail. The Polyimide or other resin base of a lengthy tape is perforated to provide device holes, a copper foil about 35 micron thick is laminated as a circuit-forming metal to the perforated tape, and the copper foil is coated with a resist, a pattern is printed, exposed to light, developed, and etched. After the removal of the resist and, where necessary, after an additional step of plating, a fine pattern of leads as in FIG. 1 is formed.

As FIG. 1 illustrates, a fragment of the base film is punched in the center to provide a device hole for mounting a semiconductor chip or the like, and leads formed from the copper foil are arranged in a high density in the hole to partly project thereinto. The width of the leads is sometimes as narrow as several ten microns.

At the electrodes of a semiconductor chip there are usually formed bumps for connection to the inner leads on the film carrier The electrodes (bumps) of the semiconductor chip and the inner leads of the film carrier are joined by the gang bonding method for simultaneous connection of all terminals involved When the leads are to be mounted on a printed-circuit board, the outer leads of copper foil are cut out together with the semiconductor element from the film carrier (by punching) and then mounted on the prited board.

The tape carrier formed this way offers many advantages including the following:

(1) It can be handled in the form of a (long) tape and precisely positioned as desired using the sprocket holes.

(2) Unlike wire bonding, the bonding seldom deforms the inner leads and permits the provision of terminals to a much finer pitch (on the order of 80 microns).

(3) The gang bonding allows for a single-step bonding regardless of the number of terminals involved.

(4) Burn-in tests of the chips as attached to the carrier are possible.

(5) The thin, flexible carrier permits correspondingly thin, flexible type of packages.

(6) The chips after packaging can be easily replaced.

This film carrier is particularly well suited for high-density package type LSIs that require larger numbers of pins than usual.

For the metal conductors (leads) to be used on the above film carrier, which are required to have high electrical conductivity, tough pitch copper foils 20 to 50 $\mu$m thick have hitherto been employed However, the tough pitch copper (pure copper) foils have number of drawbacks and none have proved satisfactory. In order to attain a high density arrangement of fine leads it is necessary to secure enhanced etching accuracy. To this end the copper foil must be made as this as possible. Nevertheless, the fine copper leads, formed by photo-etching the copper foil about 20 to 50 $\mu$m thick as stated above, tend to soften on heating during the course of fabrication. Also they are easily deformed as the resist is peeled off during etching or when the flow of plating solution changes or the film carrier comes in contact with rolls conveying it. The deformation of the fingers can lead to shorting of the terminals or imperfect bonding.

When a copper foil is bonded to a resin base with an adhesive, intimate adhesion between the foil and resin is obtained and reliability improved by the use of a high curing temperature and an adhesive for high temperature use. However, this involves a relatively long curing period (usually several hours) and presents a problem of easy softening of the ordinary pure copper foils.

An additional disadvantage with the conventional rolled copper foils forming the leads has been anisotropy in mechanical properties. There are sharp distinctions between their longitudinal (rolling direction) and lateral (normal to the rolling direction) tensile strengths and elongations.

In view of the foregoing and other considerations, the copper foil as a metal conductor on a tape carrier is required to possess the following properties:

(1) High electrical conductivity as a metal conductor.

(2) Toward the requirement for thinner foils, greater strength than pure copper, and no possibility of deformation during fabrication.

(3) Sufficient heat resistance to withstand the heat of approximately 200° C. to be encountered during the manufacture of the tape carrier.

(4) No anisotropy in strength or heat resistance, which is essential for the fingers extended in four directions.

(5) Smooth surface to permit the bonding of IC elements at the back of the fingers.

(6) Flatness of the shape for the same purpose as above.

(7) Ease of etching.

(8) Good adhesion to the resin involved.

As far as conventional tough pitch copper (pure copper basis) foil concerned, it is impossible to satisfy with all requirements stated above.

In this connection, tough pitch copper foils generally used have a following compositions:

Cu: 99.96-99.97 wt%

$O_2$: 0.025-0.035 wt% concomitant impurities: not more than 0.05 wt% (Fe, Pb, etc.)

OBJECT OF THE INVENTION

The object of this invention is to provide a film carrier which brings improvements in strength and heat resistance of the leads, thus making the reduction in their thickness possible, and eliminates the anisotropy of their mechanical properties, with the ability of being etched with increased accuracy and meeting the growing requirement for high-density multipin arrangement, and also a method of manufacturing the same.

SUMMARY OF THE INVENTION

To accomplish the above object, it is necessary to enhance the strength and heat resistance of a rolled copper foil used in a film carrier and simultaneously to eliminate or lower the anisotropy of the copper foil by preventing the growing of (100) orientation which is recrystalization texture. Under many investigations, the inventors have obtained the finding that the addition of one or more of P, B, Al, As, Cd, Co, Fe, In, Mg, Mn, Ni, Si, Sn, Te, Ag, Cr, Hf, Zn and Zr each in a specified amount is very effective for the above object According to another finding further obtained, it is perferable to suppress oxygen content to not more than 50 ppm for further enhancing heat-resistance-improving effect by the aforementioned additive elements. Based on such findings, this invention provides a film carrier comprising a resin base film and a rolled copper foil laminated thereon, said rolled copper foil forming leads for mounting semiconductor chips or other electronic components in place, characterized in that said rolled copper foil is made of a copper alloy composition consisting essentially of a total of 0.005 to 1.5% by weight of one or two or more selected from a group consisting of

| P | 0.005-0.05 | wt %, | B | 0.005-0.05 | wt %, |
|---|---|---|---|---|---|
| Al | 0.01-0.5 | wt %, | As | 0.01-0.5 | wt %, |
| Cd | 0.01-0.5 | wt %, | Co | 0.01-0.5 | wt %, |
| Fe | 0.01-0.5 | wt %, | In | 0.01-0.5 | wt %, |
| Mg | 0.01-0.5 | wt %, | Mn | 0.01-0.5 | wt %, |
| Ni | 0.01-0.5 | wt %, | Si | 0.01-0.5 | wt %, |
| Sn | 0.01-0.5 | wt %, | Te | 0.01-0.5 | wt %, |
| Ag | 0.01-1 | wt %, | Cr | 0.01-1 | wt %, |

-continued

| Hf | 0.01-1 | wt %, | Zn | 0.01-1 | wt % and |
|---|---|---|---|---|---|
| Zn | 0.01-1 | wt % | | | | and the remainder Cu with inevitable impurities, preferably with oxygen content of not more than 50 ppm. This invention also provides a method for manufacturing a film carrier characterized in that the leads of the film carrier for mounting semiconductor chips or other electronic components in place are formed by the steps of providing a rolled copper alloy foil having the composition defined above, preferably strain relief annealing it after its final cold rolling and then laminating the annealed foil onto a resin base film followed by etching.

As additive elements, one or more of In, Ag and Sn is particularly preferred.

BRIEF DESCRIPTION OF THE DRAWINGS

FIG. 2 is a graph showing the tensile strengths and elongations at varying annealing temperatures of a copper alloy foil for use in the present invention and of a tough pitch copper foil.

DETAILED EXPLANATION OF THE INVENTION

Figure 1:
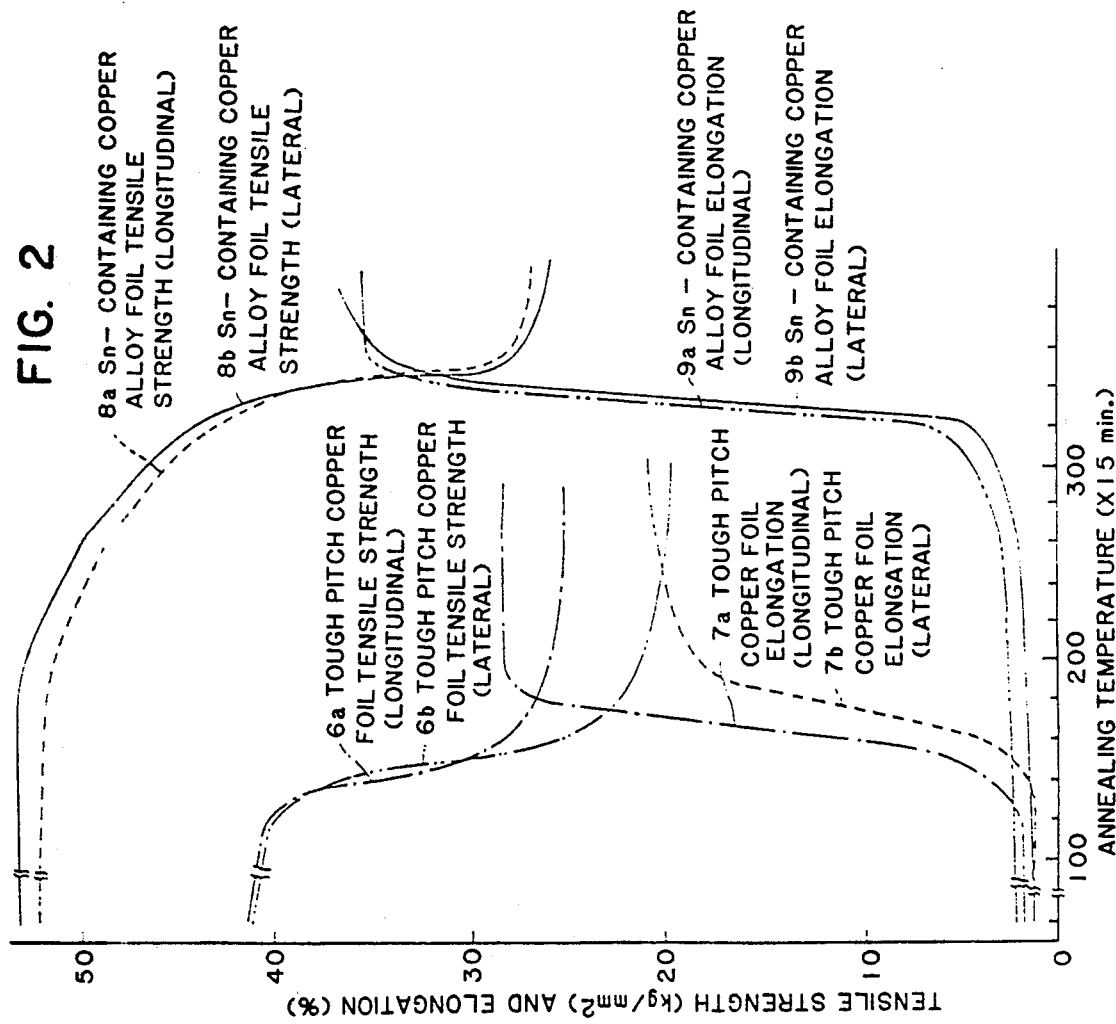
FIG. 1 is a schematic explanatory view of a typical film carrier.
Figure 1:
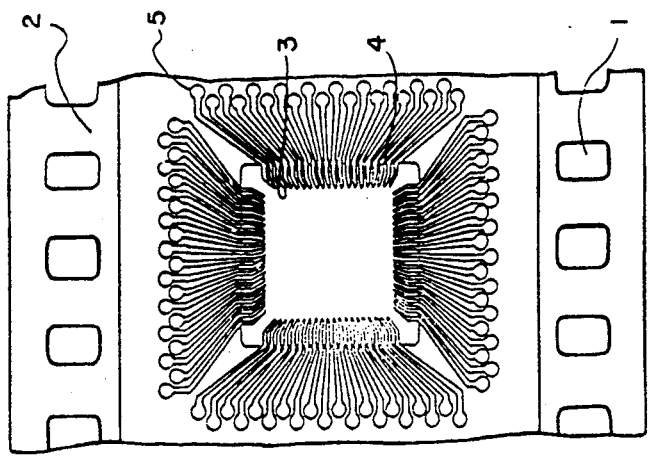

The alloying ingredients of the rolled copper foil that constitutes the present inventions, namely, P, B, Al, As, Cd, Co, Fe, In, Mg, Mn, Ni, Si, Sn, Te, Ag, Cr, Hf, Zn, and Zr, all improve the strength and heat resistance of the copper They also inhibit the development of the (100) orientation that is the recrystallized texture structure of copper, and thereby correct the anisotropy.

However, there are upper and lower limits to the percentages of these alloying ingredients to be added, as will be elucidated below.

If the P or B content is less than 0.005% by weight, or the Al, As, Cd, Co, Fe, In, Mg, Mn, Ni, Si, Sn, Te, Ag, Cr Hf, Zn, or Zr content is less than 0.01% by weight, the result will not be as satisfactory as expected. Conversely if the P or B content is more than 0.05% by weight, or the Al, As, Cd, Co, Fe, In, Mg, Mn, Ni, Si, Sn or Te content is more than 0.5% by weight, or the Ag, Cr, Hf, Zn or Zr content exceeds 1% by weight, a serious decrease in conductivity will result. The total amount of one or two or more ingredients selected from the above group is confined within the range of 0.005 to 1.5% by weight. The lower limit of 0.005% by weight is fixed for the addition of a single ingredient. As regards the upper limit the addition of two or more ingredients in a combined amount greater than 1% by weight does not always cause an appreciable decrease in conductivity due partly to the formation of intermetallic compounds. Any amount in excess of 1.5% by weight, however, causes a serious conductivity drop.

Preferable amounts to be added are as follows

| P | 0.007-0.02 | wt %, | B | 0.007-0.02 | wt %, |
|---|---|---|---|---|---|
| Al | 0.05-0.2 | wt %, | As | 0.05-0.2 | wt %, |
| Cd | 0.05-0.2 | wt %, | Co | 0.05-0.2 | wt %, |
| Fe | 0.05-0.2 | wt %, | In | 0.02-0.2 | wt %, |
| Mg | 0.05-0.2 | wt %, | Mn | 0.05-0.2 | wt %, |
| Ni | 0.05-0.2 | wt %, | Si | 0.05-0.2 | wt %, |
| Sn | 0.05-0.2 | wt %, | Te | 0.05-0.2 | wt %, |
| Ag | 0.05-0.5 | wt %, | Cr | 0.05-0.5 | wt %, |
| Hf | 0.05-0.5 | wt %, | Zn | 0.1-0.8 | wt % and |

| | | |
|---|---|---|
| Zn | 0.05-0.5 | wt % |

Among said additive elements, the addition of one or more of In, Ag and Sn is preferable.

The material having addition of In or Sn to the alloy composition of the foil that forms the leads is particularly excellent material with higher conductivity and controllability of the half-softening temperature in the range of 200° to 300° C. [Here the term half-softening temperature refers to the temperature at which the copper material usually is desired to soften when bonded with an IC chip (320° C.) and when joined to a substrate (270° C).] Moreover, it permits the copper material to be easily etched away with the commonly employed etching solutions of ferric chloride ($FeCl_3$) or copper chloride ($CuCl_2$).

Further, it is preferable to control the oxygen content in a copper film to not more than 50 ppm. When the oxygen content is controlled to not more than 50 ppm, heat resistance is remarkably enhanced. Less than 50 ppm oxygen, by contrast, enables a trace of element or elements to impart remarkable heat resistance. This is presumably attributable to the fact that a high oxygen content oxidized the alloying element added and the resulting oxide no longer contributes to the heat resistance. An oxygen content below 20 ppm is preferred.

The thickness of a copper foil generally has the range of 20 to 50 μm, but this invention is suitably applicable to a thinner foil having a thickness of 15 to 30 μm.

Such rolled copper alloy foil is made by hot rolling an ingot having a predetermined composition, appropriately repeating cold rolling and annealing and then effecting final cold rolling to a thickness required.

It is preferred that the final cold rolling is followed by strain relief annealing for the following reason. The reason is that material, as cold rolled, retains a large residual stress buildup inside. The stresses are released by the heat the material encounters during the fabrication into a film carrier (e.g., the heat at the time of joining to the resin layer or at the time of etching pattern printing). This results in shrinkage of the copper alloy foil, which can lead to deformation. The strain relief annealing that follows the final cold rolling is intended to prevent this deformation of leads to be formed from the copper alloy foil. There is no special limitation to the procedure of strain relief annealing; a suitable one of the conventional annealing methods may be used. For example, a treatment at 100° to 500° C. for 20 seconds to 1 hour may be carried out.

Typical examples of tensile strengths and elongations of a copper alloy foil for use in the present invention and a conventional tough pitch copper foil will now be explained with reference to FIG. 2. Test specimens of the copper alloy foil for use in the invention are designated Sn-containing (0.15% Sn) copper alloy foil specimens 8a, 8b 9a, and 9b, and comparative test specimens are hose of a conventional tough pitch copper, designated bright foil specimens 6a, 6b, 7a, and 7b. FIG. 2 clearly shows that the Sn-containing copper alloy foil specimens 8a, 8b retain high tensile strength at annealing temperatures (15 minutes) above 300° C.

The tensile strengths of the tough pitch copper foil specimens 6a, 6b are seen sharply declining at temperatures from about 120° C. upward, indicating very low heat-resisting strengths. This suggests seriously low reliability of the film carriers having leads made from the conventional heat-affected tough pitch rolled copper foil. With regard to the directionality of rolling, or the longitudinal (rolling) direction and lateral (normal to the rolling) direction, as can be seen with the conventional tough pitch rolled copper foil specimens in FIG. 2, there are marked differences in tensile strength (between the longitudinal 6a, and lateral, 6b, directions) and in elongation (between the longitudinal, 7a, and lateral, 7b, directions). The differences are pronounced in the temperature region of 160+ to 200° C. wherein the material is subjected to heat. A shift in position or deformation due to such anisotropy adds to the inaccuracy of the connection to components.

With the specimens of the Sn-containing copper foil as shown typically for use in the present invention, the high heat resistance as mentioned above is attained Furthermore, practically no such anisotropy as with the comparative foil in the longitudinal and lateral tensile strengths (8a and 8b) and elongations (9a and 9b). These properties contribute greatly to the reliability of the film carrier having fine leads in a high density pattern.

Similarly high heat resistance was attained with other alloy compositions for use in forming leads in accordance with the invention.

By the use of a high quality copper foil as described above, it becomes possible to manufacture a film carrier by which the density of multi-pin arrangement can be remarkably increased. As described previously, a substrate or base film is made of a resin such as polyimide, polyester, polyether sulfone, polyparabanic acid etc. A continuous elongated base film is punctured to form sprocket holes, device holes for containing IC tips or other devices etc. and a copper foil is laminated thereon with a polyester- or epoxy-based adhesive Such film including an adhesive layer is called three-layer film in the art. Thereafter, the copper foil is subjected to a series of treatments including printing, exposure, development and etching to form fine patterns as shown in FIG. 1. Then, as necessary, platings with gold, tin, lead, solder etc are made to produce a film carrier.

The material of the invention will be described more fully below in connection with Examples thereof.

EXAMPLE 1

Alloys of varying compositions according to this invention, as listed in Table 1, were melted each in a high-frequency melting furnace and cast into an ingot each. Each ingot was hot rolled at 900° C. into an 8 mm-thick plate and then cold rolled to a thickness of 1 mm. The resulting sheet was annealed at 500° C. for one hour and cold rolled to a thickness of 0.2 mm. Further annealing at 500° C. for one hour and cold rolling yielded a 0.025 mm-thick foil.

Each test material thus prepared was evaluated by the following tests. Strength was determined in terms of tensile strengths measured in the directions parallel and normal to the rolling direction. Heat resistance was determined in terms of the softening temperature in a heating period of 5 minutes. Electrical conductivity tested is expressed in %IACS. With each alloy foil a three-layer film carrier of a polyimide film was actually made and inspected for any deformation of the fingers.

As Table 1 clearly shows, the alloys of the invention are excellent in strength, heat resistance, and conductivity. With only limited anisotropy, the alloys give film carriers free from deformation. These properties make them suitable as copper alloy foils for film carriers.

TABLE 1

| | | Alloy composition (wt %) | | Tensile strength (kg/mm²) | | Softening temperature (°C.) | Conductivity (% IACS) | Deformation as film carrier |
|---|---|---|---|---|---|---|---|---|
| | | Cu | Element added | parallel to rolling direction | normal to rolling direction | | | |
| Alloy of the invention | 1 | bal. | P 0.01, Sn 0.1 | 48.3 | 48.5 | 350 | 88 | No |
| | 2 | " | B 0.02 | 48.1 | 48.0 | 350 | 94 | " |
| | 3 | " | Al 0.1 | 47.7 | 48.2 | 300 | 87 | " |
| | 4 | " | Co 0.07 | 49.4 | 49.6 | 350 | 85 | " |
| | 5 | " | In 0.1 | 51.8 | 52.4 | 350 | 95 | " |
| | 6 | " | Fe 0.05, Mn 0.05 | 49.0 | 48.8 | 350 | 92 | " |
| | 7 | " | Mg 0.06, Te 0.1 | 46.5 | 47.0 | 400 | 98 | " |
| | 8 | " | Ni 0.1, P 0.008 | 50.4 | 50.2 | 375 | 91 | " |
| | 9 | " | Cr 0.3, Si 0.03 | 53.0 | 53.1 | 425 | 88 | " |
| | 10 | " | Ag 0.2 | 47.6 | 48.0 | 400 | 98 | " |
| | 11 | " | Hf 0.02, Zr 0.15 | 52.3 | 52.6 | 475 | 96 | " |
| | 12 | " | Te 0.2 | 45.0 | 45.3 | 400 | 97 | " |
| | 13 | " | Zr 0.9, Si 0.2 | 55.7 | 56.5 | 500 | 90 | " |
| | 14 | " | Zn 1.0, Sn 0.1 | 49.0 | 49.5 | 375 | 91 | " |
| Comparative alloy | 1 | " | — | 43.0 | 45.7 | 200 | 102 | Yes |
| | 2 | " | P 0.003 | 44.8 | 45.5 | 200 | 95 | " |
| | 3 | " | Sn 0.007 | 44.3 | 45.8 | 200 | 99 | Yes (some) |
| | 4 | " | Fe 0.6, Al 0.2 | 57.0 | 58.2 | 500 | 52 | No |
| | 5 | " | Zn 1.5, Ni 0.6 | 53.6 | 54.0 | 475 | 47 | " |

EXAMPLE 2

Alloys of varying compositions for the leads on the film carrier according to this invention, as listed in Table 2, were melted each in a high-frequency melting furnace and cast into an ingot each.

Next, each ingot was hot rolled at 900° C. into an 8 mm-thick plate and then cold rolled to a thickness of 1 mm. The resulting sheet was annealed at 500° C. for one hour and cold rolled to a 0.2 mm thickness. Further annealing at 500° C. for one hour and cold rolling yielded a 0.025 mm-thick foil.

The foils were then annealed under the strain relief annealing conditions given in Table 2. Each test material thus prepared was evaluated by the following tests. Strength was determined in terms of tensile strengths measured in the directions both parallel and normal to the rolling direction. Heat resistance was determined in terms of the softening temperature in a heating period of one hour. Electrical conductivity tested is expressed in %IACS. With each alloy foil a three-layer tape carrier of a polyimide film was made and inspected for any deformation of the leads.

As Table 2 clearly shows, the alloys of the invention were excellent in strength, heat resistance, and conductivity. With only limited anisotropy, the alloys give film carriers free from deformation of the leads. These properties make them suitable as copper alloy foils for film carriers.

TABLE 2

| | | Alloy composition (wt %) | | Strain relief annealing condition | Tensile strength (kg/mm²) | Softening temperature (°C.) | Conductivity (% IACS) | Shrinkage percentage (%) |
|---|---|---|---|---|---|---|---|---|
| | | Cu | Element added | | | | | |
| Alloy of the invention | 1 | bal. | P 0.01, Sn 0.12 | 200° C. × 3 min. | 47.8 | 300 | 85 | 0.003 |
| | 2 | " | B 0.01 Ag 0.1 | 300° C. × 1 min. | 47.5 | 300 | 96 | 0.002 |
| | 3 | " | Al 0.05, As 0.02 | 200° C. × 2 min. | 47.6 | 250 | 92 | 0.003 |
| | 4 | " | In 0.1 | 200° C. × 3 min. | 51.2 | 300 | 95 | 0.003 |
| | 5 | " | Co 0.05, Te 0.1 | 250° C. × 1 min. | 48.3 | 325 | 93 | 0.003 |
| | 6 | " | Fe 0.05, Mn 0.05 | 200° C. × 2 min. | 47.7 | 300 | 92 | 0.003 |
| | 7 | " | Cr 0.1, Zr 0.05, Si 0.02 | 500° C. × 0.5 min. | 52.0 | 350 | 88 | 0.002 |
| | 8 | " | Ni 0.1, Zn 0.4 | 200° C. × 2 min. | 46.2 | 275 | 92 | 0.003 |
| | 9 | " | Mg 0.06, Hf 0.03, Cd 0.01 | 250° C. × 3 min. | 47.6 | 300 | 94 | 0.003 |
| Comparative alloy | 1 | " | P 0.01, Sn 0.12 | — | 48.7 | 300 | 86 | 0.040 |
| | 2 | " | B 0.01, Ag 0.1 | — | 48.0 | 300 | 96 | 0.038 |
| | 3 | " | Al 0.05, As 0.02 | — | 48.2 | 250 | 92 | 0.038 |
| | 4 | " | In 0.1 | — | 51.8 | 300 | 95 | 0.040 |
| | 5 | " | Co 0.05, Te 0.1 | — | 49.1 | 325 | 93 | 0.042 |
| | 6 | " | Fe 0.05, Mn 0.05 | — | 49.0 | 300 | 92 | 0.043 |
| | 7 | " | Cr 0.1, Zr 0.05, Si 0.02 | — | 52.0 | 350 | 88 | 0.040 |
| | 8 | " | Ni 0.1, Zn 0.4 | — | 47.5 | 275 | 92 | 0.039 |
| | 9 | " | Mg 0.06, Hf 0.03, Cd 0.01 | — | 48.0 | 300 | 94 | 0.043 |

EXAMPLE 3

Alloys of varying compositions for the leads on the film carrier according to this invention, as listed in Table 3, were melted each in a high-frequency melting furnace and cast into an ingot each. In order to limit the oxygen content to 50 ppm or less, a copper material containing not more than 50 ppm oxygen, termed oxygen-free or low-oxygen copper, is used and the alloy is melted and cast in a reducing or inert atmosphere to avoid the oxidation of copper. Each ingot was hot rolled at 900° C. into an 8 mm-thick plate and then cold rolled to a thickness of 1 mm. The resulting sheet was annealed at 500° C. for one hour and cold rolled to a 0.2 mm thickness. Further annealing at 500° C. for one hour and cold rolling yielded a 0.025 mm-thick foil.

Each test material thus prepared was evaluated by the following tests. Strength was determined in terms of tensile strengths measured in the directions both parallel and normal to the rolling direction. Heat resistance was determined in terms of the softening temperature in a heating period of one hour. Electrical conductivity tested in expressed in %IACS. With each alloy foil a three-layer film carrier of a polyimide film was made and inspected for any deformation of the leads.

As Table 3 clearly shows, the alloys of the invention were excellent in strength, heat resistance, and conductivity. With only limited anisotropy, the alloys give film carriers free from deformation. These properties make them suitable as copper alloy foils for film carriers.

Other samples of the invention subjected to strain relief annealing are given in Table 4. The Table 4 shows the shrinkage percentages of lead members of two alloy compositions, with strain relief annealing (Test specimen Nos. 1 and 2) and without (Nos. 3 and 4) under the influence of heat to be possibly encountered (200° C. for 10 minutes). As is clear from Table 4, the stress relief annealed specimens shrank only one-tenth or less the percentages of those not annealed. Similar tendencies were noted with the other copper alloy compositions for use in making the film carriers according to the invention. The shrinkage of the lead members does not always cause deformation of the film carriers, but it can be a factor that induces or promotes the deformation. Strain relief annealing, therefore, is desirable.

ropy, and other very serious problems. This invention has now solved all these problems and contributes greatly to the technical progress in the art and to the realization of an excellent film carrier, and further to its manufacture.

What we claim is:

1. A method for manufacturing a film carrier for mounting semiconductor chips or other electronic components in place, said method comprising:
   (a) providing a roller copper alloy foil, wherein rolled copper alloy foil comprises a composition consisting essentially of a total of 0.005 to 1.5% by weight of one or more selected from the group consisting of

| P  | 0.005-0.05 | wt %, | B  | 0.005-0.05 | wt %,     |
|----|------------|-------|----|------------|-----------|
| Al | 0.01-0.5   | wt %, | As | 0.01-0.5   | wt %      |
| Cd | 0.01-0.5   | wt %, | Co | 0.01-0.5   | wt %,     |
| Fe | 0.01-0.5   | wt %, | In | 0.01-0.5   | wt %,     |
| Mg | 0.01-0.5   | wt %, | Mn | 0.05-0.2   | wt %,     |
| Ni | 0.01-0.5   | wt %, | Si | 0.01-0.5   | wt %,     |
| Sn | 0.01-0.5   | wt %, | Te | 0.01-0.5   | wt %,     |
| Ag | 0.01-1     | wt %, | Cr | 0.01-1     | wt %,     |
| Hf | 0.01-1     | wt %, | Zn | 0.01-1     | wt % and  |
| Zr | 0.01-1     | wt %  |    |            |           | and the remainder Cu with inevitable impurities, (b) laminating said rolled copper alloy foil onto a resin base film, and (c) etching said rolled copper alloy foil.

2. The method according to claim 1 wherein said rolled copper alloy foil comprises a copper alloy com-

TABLE 3

|              |    | Alloy composition (wt %) |                          | Tensile strength (kg/mm²)    |                            | Softening           |                        |                              |
|--------------|----|--------------------------|--------------------------|------------------------------|----------------------------|---------------------|------------------------|------------------------------|
|              |    | Cu                       | Element added    | Oxygen | Parallel to rolling direction | Normal to rolling direction | temperature (°C.)   | Conductivity (% IACS)  | Deformation as film carrier  |
| Alloy        | 1  | bal.                     | P 0.01, Sn 0.1   | 0.0018 | 48.3                         | 48.5                       | 300                 | 88                     | No                           |
| of           | 2  | "                        | B 0.02           | 0.0035 | 48.1                         | 48.0                       | 275                 | 94                     | "                            |
| the          | 3  | "                        | Al 0.05 As 0.02  | 0.0020 | 48.2                         | 48.6                       | 250                 | 92                     | "                            |
| invention    | 4  | "                        | Co 0.05          | 0.0042 | 48.7                         | 49.0                       | 300                 | 97                     | "                            |
|              | 5  | "                        | In 0.1           | 0.0011 | 51.8                         | 52.4                       | 300                 | 95                     | "                            |
|              | 6  | "                        | Fe 0.05, Mn 0.05 | 0.0016 | 49.0                         | 48.8                       | 300                 | 92                     | "                            |
|              | 7  | "                        | Mg 0.06, Cd 0.03 | 0.0008 | 47.0                         | 47.5                       | 275                 | 96                     | "                            |
|              | 8  | "                        | Ni 0.1, P 0.008  | 0.0015 | 50.4                         | 50.2                       | 300                 | 91                     | "                            |
|              | 9  | "                        | Cr 0.3, Si 0.03  | 0.0010 | 51.5                         | 51.7                       | 350                 | 92                     | "                            |
|              | 10 | "                        | Ag 0.2           | 0.0032 | 47.6                         | 48.0                       | 350                 | 98                     | "                            |
|              | 11 | "                        | Hf 0.03, Zr 0.1  | 0.0010 | 50.3                         | 50.5                       | 350                 | 97                     | "                            |
|              | 12 | "                        | Te 0.2           | 0.0017 | 45.0                         | 45.3                       | 350                 | 97                     | "                            |
|              | 13 | "                        | Zr 0.9, Si 0.2   | 0.0006 | 55.7                         | 56.5                       | 450                 | 90                     | "                            |
|              | 14 | "                        | Zn 0.4, Sn 0.1   | 0.0014 | 48.0                         | 48.2                       | 300                 | 94                     | "                            |
| Comparative  | 1  | "                        | —                | 0.0010 | 43.0                         | 45.7                       | 140                 | 102                    | Yes                          |
| alloy        | 2  | "                        | Sn 0.1           | 0.0153 | 47.3                         | 47.8                       | 220                 | 98                     | Slight                       |
|              | 3  | "                        | In 0.1           | 0.0115 | 50.7                         | 51.4                       | 180                 | 95                     | Yes                          |
|              | 4  | "                        | Hf 0.03, Zr 0.1  | 0.0067 | 49.2                         | 49.5                       | 225                 | 97                     | Slight                       |
|              | 5  | "                        | Zn 1.5, Ni 0.6   | 0.0025 | 53.6                         | 54.0                       | 350                 | 47                     | No                           |

TABLE 4

| Test specimen No. | Alloy Composition (wt %) |                 |        | Strain relief annealing condition | Percentage of* shrinkage on heating (%) |
|-------------------|--------------------------|-----------------|--------|-----------------------------------|------------------------------------------|
|                   | Cu                       | Element added   | Oxygen |                                   |                                          |
| 1                 | bal.                     | P 0.01 Sn 0.1   | 0.0018 | 200° C. × 3 min.                  | 0.003                                    |
| 2                 | bal.                     | In 0.1          | 0.0011 | 300° C. × 1 min.                  | 0.003                                    |
| 3                 | bal.                     | P 0.01 Sn 0.1   | 0.0018 | —                                 | 0.035                                    |
| 4                 | bal.                     | In 0.1          | 0.0011 | —                                 | 0.003                                    |

*Percentage of shrinkage on heating at 200° C. for 10 min.

ADVANTAGEOUS EFFECTS OF THE INVENTION

Film carriers capable of achieving greater packaging densities than heretofore required of the leads are under development to keep up with the rapid tendency toward multipin arrangements along with the increasing degrees of integration for ICs, LSIs, and the like. The finer and narrower arrangements and configurations of leads are posing deformation, shorting, anisotposition consisting essentially of one or more elements selected from the group consisting of In, Sn and Ag and the remainder Cu with inevitable impurities.

3. The method according to claim 1 having an oxygen concentration of not more than 50 ppm.

4. A method for manufacturing a film carrier for mounting semiconductor chips or other electronic components in place, said method comprising:
(a) providing a rolled copper alloy foil, wherein said rolled copper alloy foil comprises a composition consisting essentially of a total of 0.005 to 1.5% by weight of one or more selected from the group consisting of

| P | 0.005–0.05 | wt %, | B | 0.005–0.05 | wt %, |
|---|---|---|---|---|---|
| Al | 0.01–0.5 | wt %, | As | 0.01–0.5 | wt % |
| Cd | 0.01–0.5 | wt %, | Co | 0.01–0.5 | wt %, |
| Fe | 0.01–0.5 | wt %, | In | 0.01–0.5 | wt %, |
| Mg | 0.01–0.5 | wt %, | Mn | 0.05–0.2 | wt %, |
| Ni | 0.01–0.5 | wt %, | Si | 0.01–0.5 | wt %, |
| Sn | 0.01–0.5 | wt %, | Te | 0.01–0.5 | wt %, |
| Ag | 0.01–1 | wt %, | Cr | 0.01–1 | wt %, |
| Hf | 0.01–1 | wt %, | Zn | 0.01–1 | wt % and |
| Zr | 0.01–1 | wt % | | | | and the remainder Cu with inevitable impurities,
(b) strain relief annealing said rolled copper alloy foil after its final cold rolling,
(c) laminating said annealed rolled copper alloy foil onto a resin base film, and
(d) etching said annealed rolled copper alloy foil.

5. The method according to claim 4 wherein said rolled copper alloy foil comprises a composition consisting essentially of one or more elements selected from the group consisting of In, Sn and Ag and the remainder Cu with inevitable impurities.

6. The method according to claim 4 having an oxygen concentration of not more than 50 ppm.

7. The method according to claim 2 wherein said rolled copper alloy foil has an oxygen content of not more than 50 ppm.

8. The method according to claim 7 wherein the oxygen content of said rolled copper alloy foil is not more than 20 ppm.

9. The method according to claim 3 wherein the oxygen content of said rolled copper alloy foil is not more than 20 ppm.

10. The method according to claim 5 wherein said rolled copper alloy foil has an oxygen content of not more than 50 ppm.

11. The method according to claim 10 wherein the oxygen content of said rolled copper alloy foil is not more than 20 ppm.

12. The method according to claim 6 wherein the oxygen content of said rolled copper alloy foil is not more than 20 ppm.

13. A method for manufacturing a film carrier for mounting semi-conductor chips or other electronic components in place, said method comprising:
(a) providing a rolled copper alloy foil, wherein said rolled copper alloy foil comprises a composition consisting essentially of a total of 0.005 to 1.5% by weight of one or more selected from the group consisting of

| P | 0.007–0.02 | wt %, | B | 0.007–0.02 | wt %, |
|---|---|---|---|---|---|
| Al | 0.05–0.2 | wt %, | As | 0.05–0.2 | wt %, |
| Cd | 0.05–0.2 | wt %, | Co | 0.05–0.2 | wt %, |
| Fe | 0.05–0.2 | wt %, | In | 0.02–0.2 | wt %, |
| Mg | 0.05–0.2 | wt %, | Mn | 0.05–0.2 | wt %, |
| Ni | 0.05–0.2 | wt %, | Si | 0.05–0.2 | wt %, |
| Sn | 0.05–0.2 | wt %, | Te | 0.05–0.2 | wt %, |
| Ag | 0.05–0.5 | wt %, | Cr | 0.05–0.5 | wt %, |
| Hf | 0.05–0.5 | wt %, | Zn | 0.1–0.8 | wt % and |
| Zr | 0.05–0.5 | wt % | | | | and the remainder Cu with inevitable impurities,
(b) laminating said rolled copper alloy foil onto a resin base film, and
(c) etching said rolled copper alloy foil.

14. The method according to claim 13 wherein said rolled copper alloy foil comprises a copper alloy composition consisting essentially of one or more elements selected from the group consisting of In, Sn and Ag and the remainder Cu with inevitable impurities.

15. The method according to claim 14 wherein said rolled copper alloy foil has an oxygen content of not more than 50 ppm.

16. The method according to claim 15 wherein the oxygen content of said rolled copper alloy foil is not more than 20 ppm.

17. The method according to claim 13 wherein said rolled copper alloy foil has an oxygen content of not more than 50 ppm.

18. The method according to claim 17 wherein the oxygen content of said rolled copper alloy foil is not more than 20 ppm.

19. A method for manufacturing a film carrier for mounting semi-conductor chips or other electronic components in place, said method comprising:
(a) providing a rolled copper alloy foil, wherein said rolled copper alloy foil comprises a composition consisting essentially of a total of 0.005 to 1.5% by weight of one or more selected from the group consisting of

| P | 0.007–0.02 | wt %, | B | 0.007–0.02 | wt %, |
|---|---|---|---|---|---|
| Al | 0.05–0.2 | wt %, | As | 0.05–0.2 | wt % |
| Cd | 0.05–0.2 | wt %, | Co | 0.05–0.2 | wt %, |
| Fe | 0.05–0.2 | wt %, | In | 0.02–0.2 | wt %, |
| Mg | 0.05–0.2 | wt %, | Mn | 0.05–0.2 | wt %, |
| Ni | 0.05–0.2 | wt %, | Si | 0.05–0.2 | wt %, |
| Sn | 0.05–0.2 | wt %, | Te | 0.05–0.2 | wt %, |
| Ag | 0.05–0.5 | wt %, | Cr | 0.05–0.5 | wt %, |
| Hf | 0.05–0.5 | wt %, | Zn | 0.1–0.8 | wt % and |
| Zr | 0.05–0.5 | wt % | | | | and the remainder Cu with inevitable impurities,
(b) strain relief annealing said rolled copper alloy foil after its final cold rolling,
(c) laminating said annealed rolled copper alloy foil onto a resin base film, and
(d) etching said rolled copper alloy foil.

20. The method according to claim 19 wherein said rolled copper alloy foil comprises a copper alloy composition consisting essentially of one or more elements selected from the group consisting of In, Sn and Ag and the remainder Cu with inevitable impurities.

21. The method according to claim 20 wherein said rolled copper alloy foil has an oxygen content of not more than 50 ppm.

22. The method according to claim 21 wherein the oxygen content of said rolled copper alloy foil is not more than 20 ppm.

23. The method according to claim 19 wherein said rolled copper alloy foil has an oxygen content of not more than 50 ppm.

24. The method according to claim 23 wherein the oxygen content of said rolled copper alloy foil is not more than 20 ppm.

* * * * *

UNITED STATES PATENT AND TRADEMARK OFFICE
CERTIFICATE OF CORRECTION

PATENT NO. : 5,004,520
DATED : April 2, 1991
INVENTOR(S) : Tsuji, et al.

It is certified that error appears in the above—identified patent and that said Letters Patent is hereby corrected as shown below:

Title page:
In the ABSTRACT, line 13, column 4 of the Table therein, delete "0.01-0.5" and substitute therefor -- 0.05-0.2 --.

In the ABSTRACT, line 18, column 1 of the Table therein, delete "Zn" and substitute therefor --Zr--.

In the Summary of the Invention, column 3, line 65, in the fourth column of the Table, delete "0.01-0.5" and substitute therefor -- 0.05-0.2 --.

In the Summary of the Invention, column 4, line 2, in the first column of the Table, delete "Zn" and substitute therefor --Zr--.

In the Detailed Explanation of the Invention, column 4, line 40, after "Mg," delete "Mn,"; same column, line 42, before "the" insert --or the Mn content is less than 0.05% by weight, --; same column, line 44, after "Mg," delete "Mn,"; and same column, line 46, before "a" insert --or the Mn content is more than 0.2% by weight,--.

UNITED STATES PATENT AND TRADEMARK OFFICE
CERTIFICATE OF CORRECTION

PATENT NO. : 5,004,520

DATED : April 2, 1991

INVENTOR(S) : Tsuji, et al.

It is certified that error appears in the above-identified patent and that said Letters Patent is hereby corrected as shown below:

In the Detailed Explanation of the Invention, column 5, line 1, column 1 of the Table, delete "Zn" and substitute therefor --Zr--.

Signed and Sealed this

Sixth Day of October, 1992

Attest:

DOUGLAS B. COMER

*Attesting Officer*  *Acting Commissioner of Patents and Trademarks*